(12) United States Patent
Merry et al.

(10) Patent No.: US 8,894,344 B2
(45) Date of Patent: Nov. 25, 2014

(54) VERTICAL WAFER BUFFERING SYSTEM

(75) Inventors: Nir Merry, Mountain View, CA (US); Jacob Newman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 875 days.

(21) Appl. No.: 12/196,982

(22) Filed: Aug. 22, 2008

(65) Prior Publication Data
US 2010/0047049 A1 Feb. 25, 2010

(51) Int. Cl.
*B65G 1/04* (2006.01)
*H01L 21/677* (2006.01)

(52) U.S. Cl.
CPC ......... *H01L 21/67769* (2013.01); *Y10S 414/14* (2013.01)
USPC .......................................... 414/281; 414/940

(58) Field of Classification Search
USPC .......................................... 414/940, 277, 281
See application file for complete search history.

(56) References Cited

U.S. PATENT DOCUMENTS

| | | | |
|---|---|---|---|
| 5,964,561 A | 10/1999 | Marohl | |
| 6,224,313 B1 * | 5/2001 | Fukushima et al. | 414/280 |
| 6,579,052 B1 * | 6/2003 | Bonora et al. | 414/222.01 |
| 6,726,429 B2 | 4/2004 | Sackett et al. | |
| 7,134,825 B1 | 11/2006 | Schmutz et al. | |

FOREIGN PATENT DOCUMENTS

| | | |
|---|---|---|
| JP | 2000260848 A | 9/2000 |
| JP | 2001028388 A | 1/2001 |
| JP | 2002246432 A | 8/2002 |

OTHER PUBLICATIONS

International Search Report and Written Opinion mailed Mar. 30, 2010 for PCT Application No. PCT/US2009/054577.

* cited by examiner

*Primary Examiner* — Jonathan Snelting
(74) *Attorney, Agent, or Firm* — Moser Taboada; Alan Taboada

(57) ABSTRACT

A wafer buffering system is provided herein. In some embodiments, a wafer buffering system may include a frame having a vertical shaft disposed therethrough; two storage platforms, coupled to the frame on either side thereof, each to receive a wafer carrier thereon; and a transfer mechanism coupled to the vertical shaft and capable of vertical movement therealong and lateral movement along an x-axis extending in either direction from the frame at least sufficient to move over the two storage platforms. The transfer mechanism may further include a telescoping fork arm capable of laterally extending in a first direction and in a second direction corresponding to lateral positions of the two storage platforms on either side of the frame.

20 Claims, 3 Drawing Sheets

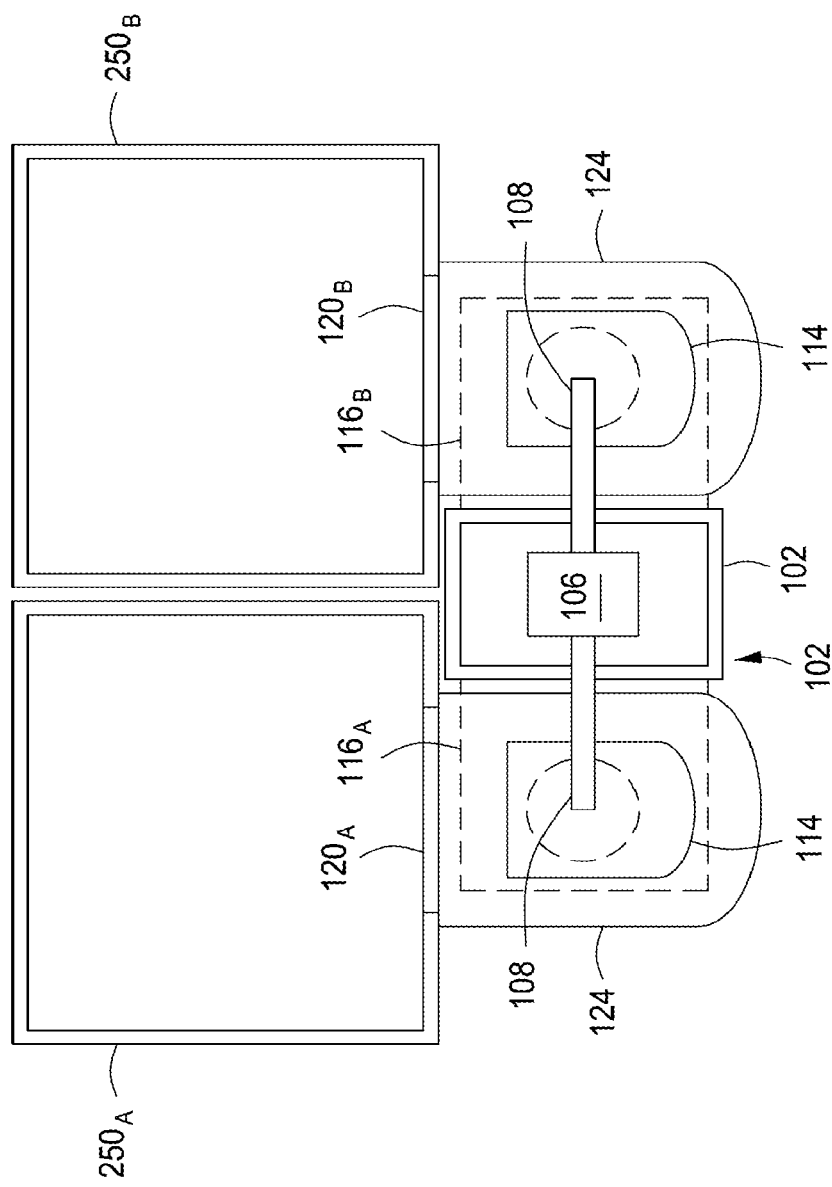

VERTICAL WAFER BUFFERING SYSTEM

BACKGROUND OF THE INVENTION

1. Field of the Invention

Embodiments of the present invention generally relate to semiconductor processing equipment.

2. Description of the Related Art

The throughput of semiconductor wafers in semiconductor process equipment is often limited by the ability to supply wafer carriers (also referred to as FOUPs, Front Opening Unified Pods) containing unprocessed wafers to the process equipment. To improve throughput a wafer buffering system may be utilized to store and buffer FOUPS during wafer processing operations.

Conventional wafer buffering systems may include, for example, multiple load ports where a wafer carrier is placed at each load port and is removed after all wafers have been processed. These systems have large footprints, taking up a sizeable amount of floor space. Other systems may include vertically oriented apparatus where the wafers are buffered for processing in a narrower footprint, but typically require several transfer mechanisms, such as transfer robots, to operate effectively. These systems are prohibitively expensive to implement.

Thus, there is a need for a wafer buffering system which has a high throughput, yet is scalable and cost effective.

SUMMARY

A wafer buffering system is provided herein. In some embodiments, a wafer buffering system may include a frame having a vertical shaft disposed therethrough; two storage platforms, coupled to the frame on either side thereof, each for receiving a wafer carrier thereon; and a transfer mechanism coupled to the vertical shaft and capable of vertical movement therealong and lateral movement along an x-axis extending in either direction from the frame at least sufficient to move over the two storage platforms. In some embodiments, the transfer mechanism may further include a telescoping fork arm capable of laterally extending in a first direction and in a second direction corresponding to lateral positions of the two storage platforms on either side of the frame. In some embodiments, the two storage platforms comprise at least one of an overhead track (OHT) interface platform or stationary buffer platform. In some embodiments, the wafer buffering system comprises a first and a second OHT interface platform and a first and a second stationary buffer platform.

In some embodiments, an apparatus for processing a semiconductor wafer may include a semiconductor process apparatus having a first and a second load port; and a wafer buffering system to receive and to buffer wafer carriers disposed between the first and second load ports, the wafer buffering system including a frame having a vertical shaft disposed therethrough; two storage platforms, coupled to the frame on either side thereof, each to receive a wafer carrier thereon; and a transfer mechanism coupled to the vertical shaft and capable of vertical movement therealong and lateral movement along an x-axis extending in either direction from the frame at least sufficient to move over the two storage platforms.

Other and further embodiments, features, and aspects of the present invention may be found in the detailed description, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2-3 depicts a schematic diagrams of an apparatus (e.g. semiconductor process chamber) utilizing a wafer buffering system in accordance with some embodiments of the present invention.

Figure 1:
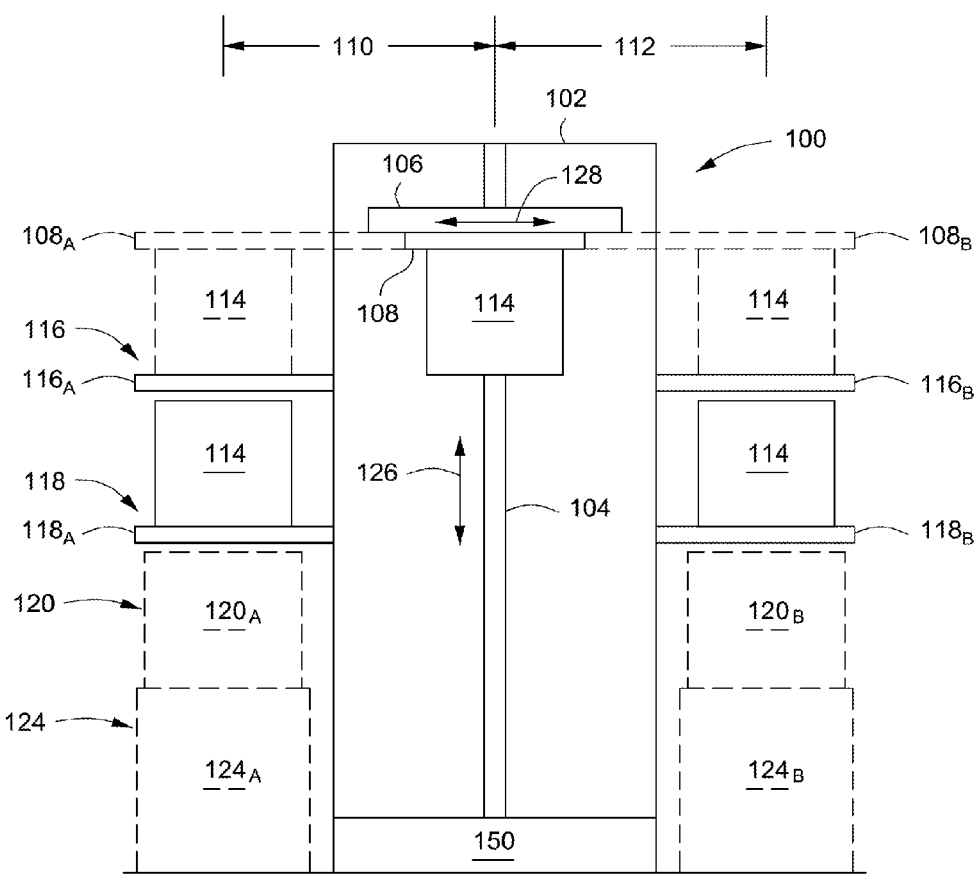
FIG. 1 depicts a schematic diagram of a wafer buffering system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide wafer buffering systems for improved throughput of semiconductor wafers in a semiconductor process apparatus. The wafer buffering system is vertically oriented and may be a standalone system that is manually loaded and unloaded with wafer carriers by an operator, or may be coupled to a factory system (e.g., a monorail, or overhead track (OHT)) capable of automated delivery and retrieval of wafer carriers prior to, and after processing. The wafer buffering system may service a semiconductor processing apparatus, such as one or two standalone process chambers, or one or more process chambers disposed in a cluster tool. In some embodiments, the semiconductor processing apparatus may be a cluster tool having a factory interface with a first and a second load port, wherein the wafer buffering system may be disposed between the first and second load ports. The wafer buffering system may advantageously improve throughput of semiconductor wafers while being cost effective to manufacture and capable of being disposed between two semiconductor process chambers.

FIG. 1 depicts a wafer buffering system 100 for receiving and buffering wafer carriers in accordance with some embodiments of the present invention. The wafer buffering system 100 may receive wafer carriers manually from an operator, or from an automated system. Further, the wafer buffering system 100 may service two process chambers simultaneously, as described below with respect to FIG. 2.

The wafer buffering system 100 generally includes a frame 102, two or more storage platforms (e.g., 116 and 118) coupled to the frame 102, a single transfer mechanism 106 movably coupled to the frame 102 between the two or more storage platforms, and controls 150 for controlling the operation of the wafer buffering system 100. The two or more storage platforms provide additional storage and buffering for the process tool which it is servicing and further provide an interface for the loading and unloading of wafer carriers. The transfer mechanism 106 provides two degrees of freedom of movement—vertical along a central axis and horizontally to either side of the frame 102. The controller 150 may be any suitable controller for controlling the movement of the transfer mechanism 106 (such as a computer having a CPU, support circuits, and a memory) and may interface with a factory controller or other controller (not shown) coupled to a semiconductor processing tool.

The frame 102 supports the two or more storage platforms (e.g., 116 and 118) and may house the transfer mechanism 106. As such, the frame 102 may be of any suitable shape, dimension, and/or footprint necessary for at least one of housing the transfer mechanism 106, supporting a desired number of storage platforms, fitting within the factory (e.g., beneath a ceiling, an overhead rail, or the like), or fitting between two load ports (e.g., 120) of a semiconductor process apparatus.

As illustrated in FIG. 1, the frame 102 has a vertical shaft 104 disposed centrally therethrough. The vertical shaft 104 (e.g., a z-axis) may have the transfer mechanism 106 movably coupled thereto, such that the transfer mechanism is vertically movable along the shaft 104 (as shown by arrows 126). The mechanism 106 may be movably coupled to the vertical shaft 104 by any suitable mechanism. For example, the vertical shaft 104 may be a rotatable splined shaft (e.g., such as a lead screw) coupled to a motor capable of rotating the vertical shaft 104 (e.g., such as a stepper motor or a servo motor). The transfer mechanism 106 may have a mating collar having the shaft 104 passing therethrough such that the rotation of the shaft 104 may control the vertical position of the transfer mechanism 106. Alternatively, the transfer mechanism 106 may have a high friction rotatable mechanism, such as rubber wheels that may securely grip the shaft and be rotated to control the vertical position of the transfer mechanism 106. Of course, any other suitable mechanism may be utilized to control the vertical position of the transfer mechanism 106, such as, for example, a telescoping arm or other mechanism.

The transfer mechanism 106 is configured for transporting wafer carriers 114. The transfer mechanism 106 is further laterally movable (e.g., in the x direction) to either side of the frame 102 (as shown by arrows 128). For example, the transfer mechanism 106 may further comprise a telescopic fork arm 108 that may extend laterally to either side of the frame 102. As shown in FIG. 1, the telescopic fork arm 108 may move laterally to one side of the frame 102 (as shown in phantom at $108_A$) and to the other side of the frame 102 (as shown in phantom at $108_B$). The telescopic fork arm 108 may be of any suitable geometry necessary to capture, hold and/or transport a wafer carrier 114. For example, the telescopic fork arm 108 may interface with a feature formed on the top of the wafer carrier 114 to securely couple thereto when carrying the wafer carriers 114.

In some embodiments, the telescopic fork arm 108 may be capable of extending from the vertical shaft 104 horizontally in a first direction to a first distance 110 and from the vertical shaft 104 horizontally in a second direction to a second distance 112. The first and second directions are suitable for placing or retrieving wafer carriers on the two or more storage platforms. As such, the first and second directions are generally opposite and the first and second distances 110, 112 may be equal.

The transfer mechanism 106 may retrieve and return wafer carriers 114, one at a time, to two or more storage platforms coupled to the frame 102. In some embodiments, the storage platforms are capable of buffering and/or receiving the wafer carriers 114. The two or more storage platforms may include at least one of an overhead track (OHT) interface platform 116 or a stationary buffer platform 118. In some embodiments, the storage platforms may be arranged in pairs, wherein two storage platforms may have substantially equivalent vertical positions (e.g., height, or position on the frame 102) and x-axis positions that may be equal in magnitude and opposite in direction from the z-axis. The position of the two or more storage platforms may be of any suitable configuration, including for instance, staggered configurations, such that the wafer buffering system can maximize wafer carrier throughput while simultaneously servicing at least two load ports.

In some embodiments, the storage platforms of the wafer buffering system 100 include a first and second OHT interface platform $116_{A-B}$. As illustrated in FIG. 1, the first and second OHT interface platforms $116_{A-B}$ are arranged in a pair as described above. However, other arrangements are possible. The OHT interface platform may be capable of both receiving a wafer carrier from a factory system (e.g., an overhead track or a monorail system) or from the transfer mechanism 106, which may return a wafer carrier of processed wafers for pick up by the OHT. Further, an OHT interface platform may be capable of buffering a wafer carrier awaiting transfer to a load port by the transfer mechanism. A storage platform may be considered an OHT interface platform when no additional storage platforms are disposed thereabove, allowing direct interface with an OHT.

In some embodiments, the storage platforms of the wafer buffering system 100 further include a first and second stationary buffer platform $118_{A-B}$. As illustrated in FIG. 1, the first and second stationary buffer platforms $118_{A-B}$ may be arranged in a pair as described above. However, other configurations are possible. In some embodiments, the first and second stationary buffer platforms $118_{A-B}$ are located below the first and second OHT interface platforms $116_{A-B}$ respectively, as illustrated in FIG. 1. A stationary buffer platform 118 may be capable of receiving and holding a wafer carrier 114 supplied by the transfer mechanism 106, both before and after the wafer carrier 114 has been processed. A storage platform may be considered a stationary buffer platform 118 when the storage platform is not capable of interfacing with an OHT or monorail system. In some embodiments, as illustrated in FIG. 1, the stationary buffer platform 118 is incapable of interfacing with the OHT or monorail system when having an OHT interface platform 116 disposed thereabove. However, the stationary buffer platform 118 may be manually loaded by an operator, or by an overhead transfer mechanism configured to be able to load a platform from the side rather than from the top, and is thus capable of receiving a wafer carrier from a source other than an overhead transfer mechanism that loads only from the top. Additional stationary buffer platforms 118 may be provided and may be configured similarly to the stationary buffer platforms $118_{A-B}$ discussed above.

The geometry of the frame 102, the transfer mechanism 106, and/or the storage platforms (e.g., the OHT interface platforms $116_{A-B}$ and the stationary buffer platforms $118_{A-B}$) may be configured to correspond to the locations of the processing chambers being serviced by the wafer buffering system 100. For example, as depicted in FIG. 1, the frame 102 of the wafer buffering system 100 may be disposed between a first and a second load platform $124_{A-B}$ (shown in phantom) for servicing a first and a second load port $120_{A-B}$ (shown in phantom). The first and second load platforms $124_{A-B}$ may be disposed on either side of the frame 102 and have respective x-axis positions corresponding to those of the first or second storage platforms $116_{A-B}$, $118_{A-B}$ beneath which they are located. In some embodiments, and as illustrated in FIG. 1, each load platform $124_{A-B}$ is respectively located beneath the first and second stationary buffer platforms $118_{A-B}$.

Each load platform $124_{A-B}$ is capable of supporting and interfacing with a wafer carrier 114 may include mating pins, holes, notches, or other mechanisms (not shown) disposed on both the wafer carrier 114 and the load platform 124. Through one or more such interface mechanisms, a determination may be made such as the presence of a wafer carrier 114, the count of unprocessed wafers remaining in the wafer carrier 114, the count of processed wafers returned to the wafer carrier 114, or the like. Information may be relayed from an interface mechanism on a load platform 124 to a controller that may control the semiconductor process apparatus and/or the wafer buffering system. The controller may issue instructions, for example, to the transfer mechanism to pick up a used wafer carrier 114 from a load platform 124, or to the OHT to deliver a new wafer carrier 114.

Although illustrated in FIG. 1 as having a height corresponding to the bottom of a load port 120, it is contemplated that each load platform $124_{A-B}$ may comprise a shelf protruding outward from the semiconductor process apparatus and supported thereby. In such a configuration of the load platform 124, the first and second stationary buffer platforms $118_{A-B}$ may be disposed beneath the load platform 124. Alternatively, an additional pair of stationary buffer platforms 118 may be located at the base of the frame 102. Alternatively, one or more of the load ports $120_{A-B}$ may be replaced with respective stationary buffer platforms $118_{A-B}$.

Figure 2:
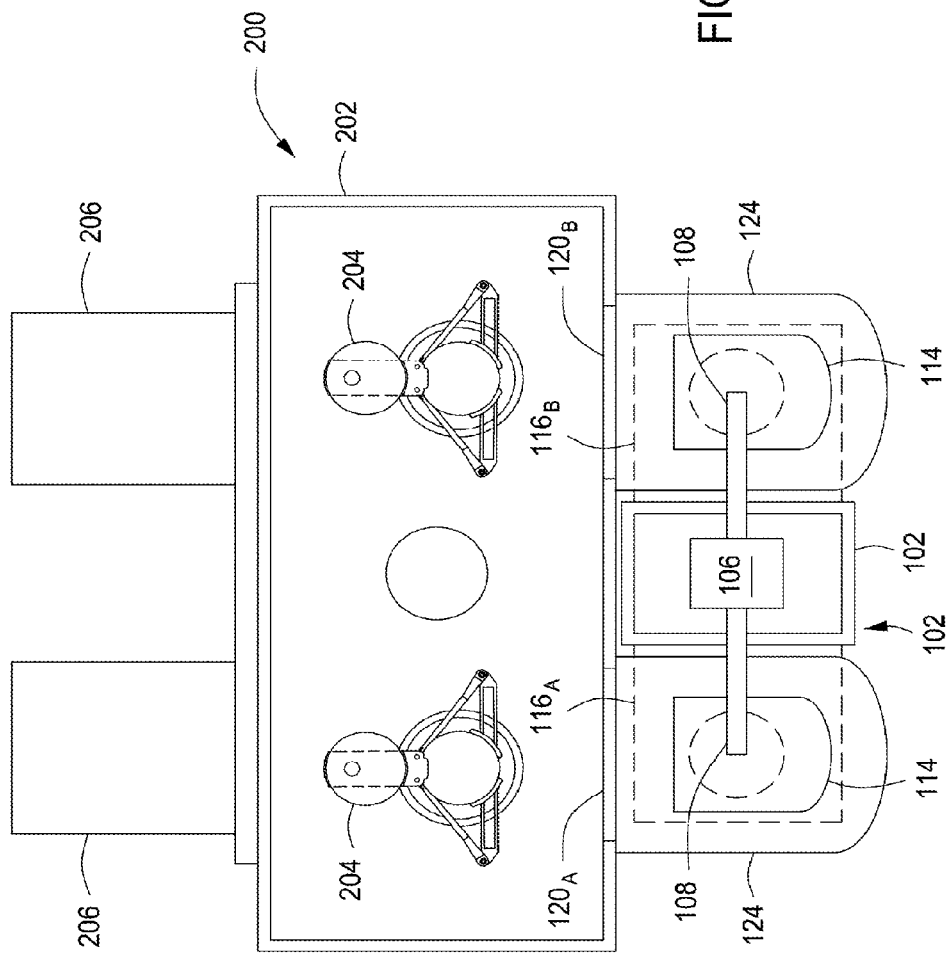

In some embodiments, the wafer buffering system 100 may be disposed between a first and second load port $120_{A-B}$ of a semiconductor process apparatus as illustrated in FIG. 2. For example, as illustrated in FIG. 2, the load ports $120_{AB}$ may be disposed in a factory interface 202 as part of a semiconductor process apparatus 200. The factory interface 202 may include one or more transfer robots 204 contained therein for transferring wafers between the wafer carrier 114 and one or more semiconductor processing chambers (not shown) coupled to the factory interface 202 via one or more load locks 206. In some embodiments, such as illustrated in FIG. 2, the factory interface 202 may include two transfer robots 204, each robot serving a load port 120 and transferring a wafer between the wafer carrier 114 present at the load port 120 and a semiconductor process chamber via the respective load lock 206. The semiconductor process chamber coupled to the one or more load locks 206 may be a cluster tool, such as one of the CENTURA® line, available from Applied Materials, Inc. of Santa Clara, Calif. The cluster tool may have a central vacuum chamber coupled to the load locks and having a transfer robot therein which may be capable of receiving (or returning) a wafer from (or to) a transfer robot 204 via the load locks 206.

Alternatively, in some embodiments, the semiconductor process apparatus may comprise standalone process chambers (illustrated in FIG. 3). For example, the semiconductor process apparatus may comprise a first process chamber ($250_A$ having the first load port $120_A$ and a second process chamber $250_B$ having the second load port $120_B$. The first and second process chamber may be any suitable process chambers capable of accepting the wafer carrier 114, and may perform any processes upon the wafer, such as etching, chemical vapor deposition, physical vapor deposition, plasma or thermal oxidation, and the like.

In operation, and referring to FIGS. 1-2, a wafer carrier 114 may be supplied to the first OHT interface platform $116_A$ by an OHT system. The transfer mechanism 106 may extend the telescopic fork arm 108 in the first direction over the first distance 110 to retrieve the wafer carrier 114 from the first OHT interface platform $116_A$. The telescopic fork arm 108 may then retract with the wafer carrier 114 coupled thereto, and secure the wafer 114 beneath the transfer mechanism 106 (as illustrated in FIG. 1) such that the wafer carrier 114 resides within the frame 102. The transfer mechanism may move along the vertical shaft 104 and stop at a position corresponding to either the first or second stationary buffer platforms $118_{A-B}$ or above either the first or second load platforms $124_{A-B}$. The telescopic fork arm 108 may extend in the first or second direction over the first distance 110 or the second distance 112 with the wafer carrier 114 coupled thereto, and place the wafer carrier 114 on either the first or second stationary buffer platform $118_{A-B}$ or the first or second load platform $124_{A-B}$. Upon depositing the wafer carrier 114 on one of the available platforms, the transfer mechanism 106 may perform any number of operations including retrieve another wafer carrier 114 with processed wafers from a load platform 124 and return the wafer carrier 114 to either a stationary buffer platform 118 or an OHT transfer platform 116; return to an OHT interface platform 116 to retrieve another wafer carrier 114 having unprocessed wafers; retrieve a wafer carrier 114 having unprocessed wafers from a stationary buffer platform 118 and place the wafer carrier 114 on a load platform 124 to be processed; or the like.

Thus, wafer buffering systems for receiving and buffering wafer carriers are provided herein. The wafer buffering systems are vertically oriented and provide vertical and lateral movement of wafer carriers to either side of the wafer buffering system. The wafer buffering systems may be standalone systems that may be manually loaded and unloaded with wafer carriers by an operator, or may be coupled to a factory system (e.g., a monorail, or overhead track (OHT)) capable of delivering and retrieving wafer carriers prior to and after processing. The wafer buffering system may service a semiconductor process apparatus comprising one or more process chambers in standalone or cluster configurations. In some embodiments, the semiconductor process apparatus may comprise a first and second load port having the wafer buffering system disposed therebetween, thereby providing additional wafer carrier storage to act as a wafer carrier buffer on the semiconductor process apparatus. The wafer buffering system may advantageously improve throughput of semiconductor wafers while being cost effective to manufacture and, may be capable of being disposed between two semiconductor process chambers.

While the foregoing is directed to embodiments of the present invention, other and further embodiments of the invention may be devised without departing from the basic scope thereof, and the scope thereof is determined by the claims that follow.

What is claimed is:

1. A wafer buffering system, comprising:
   a frame having a vertical shaft disposed therethrough;
   two storage platforms, coupled to the frame on opposing sides of the shaft, each to receive a wafer carrier thereon, wherein the position of the vertical shaft is fixed relative to each of the two storage platforms; and
   a transfer mechanism coupled to the vertical shaft and capable of vertical movement therealong and lateral movement along an x-axis extending in either direction from the frame at least sufficient to move linearly along the x-axis from one of the two storage platforms to the other.

2. The wafer buffering system of claim 1, wherein the transfer mechanism further comprises:
   a telescoping fork arm capable of laterally extending in a first direction and in a second direction corresponding to lateral positions of the two storage platforms on either side of the frame.

3. The wafer buffering system of claim 1, wherein the two storage platforms comprise at least one of an overhead track (OHT) interface platform or a stationary buffer platform.

4. The wafer buffering system of claim 3, wherein the two storage platforms comprise a first OHT interface platform and a second OHT interface platform.

5. The wafer buffering system of claim 4, wherein the two storage platforms further comprise a first stationary buffer platform and a second stationary buffer platform.

6. The wafer buffering system of claim 5, wherein the transfer mechanism is adapted to transfer a wafer carrier from the first or second OHT platforms or the first or second stationary buffer platforms to at least one of the first or second OHT platforms or the first or second stationary buffer platforms.

7. The wafer buffering system of claim 1, further comprising: a controller to control the operation of the wafer buffering system.

8. The wafer buffering system of claim 7, wherein the controller is configured to interface with at least one of a factory controller or a controller coupled to a semiconductor processing tool.

9. The wafer buffering system of claim 1, wherein the vertical shaft is disposed centrally through the frame, and wherein all of the storage platforms of the wafer buffering system are disposed in a common vertical plane.

10. An apparatus for processing a semiconductor wafer comprising:
a semiconductor process apparatus having a first and a second load port; and
a wafer buffering system to receive and to buffer wafer carriers, the wafer buffering system disposed between the first and second load ports, the wafer buffering system comprising:
a frame having a vertical shaft disposed therethrough;
two storage platforms, coupled to the frame on opposing sides of the shaft, each to receive a wafer carrier thereon, wherein the position of the vertical shaft is fixed relative to each of the two storage platforms; and
a transfer mechanism coupled to the vertical shaft and capable of vertical movement therealong and lateral movement along an x-axis extending in either direction from the frame at least sufficient to move linearly along the x-axis from one of the two storage platforms to the other.

11. The apparatus of claim 10, wherein the first and second load ports are disposed within a factory interface.

12. The apparatus of claim 10, the transfer mechanism further comprising:
a telescoping fork arm capable of laterally extending in a first direction and in a second direction corresponding to lateral positions of the two storage platforms.

13. The apparatus of claim 10, wherein the two storage platforms comprise at least one of an overhead track (OHT) interface platform or a stationary buffer platform.

14. The apparatus of claim 13, wherein the two storage platforms comprise a first OHT interface platform and a second OHT interface platform.

15. The apparatus of claim 14, wherein the two storage platforms further comprise a first stationary buffer platform and a second stationary buffer platform.

16. The apparatus of claim 15, wherein the transfer mechanism is adapted to transfer a wafer carrier from the first or second OHT platforms or the first or second stationary buffer platforms to at least one of the first or second OHT platforms or the first or second stationary buffer platforms.

17. The apparatus of claim 10, further comprising:
a controller to control the operation of the wafer buffering system.

18. The apparatus of claim 17, wherein the controller is configured to interface with at least one of a factory controller or a controller coupled to a semiconductor processing tool.

19. A wafer buffering system, comprising:
a frame having a vertical shaft disposed therethrough;
a plurality of storage platforms each to receive a wafer carrier thereon, wherein at least one storage platform is disposed on an opposite side of the shaft and at a same vertical height as one other storage platform, wherein all of the storage platforms are arranged along a vertical plane; and
a transfer mechanism coupled to the vertical shaft and capable of movement along the vertical plane at least sufficient to transfer wafer carriers to and from each of the storage platforms.

20. The apparatus of claim 10, wherein all of the storage platforms of the wafer buffering system are disposed in a common vertical plane.

* * * * *